United States Patent [19]

Ferri et al.

[11] Patent Number: 4,479,089
[45] Date of Patent: Oct. 23, 1984

[54] PROCESS AND APPARATUS TO CHECK THE PRESENCE AND/OR EFFICIENCY OF MICROCOMPONENTS DURING THE ASSEMBLING THEREOF ON PRINTED CIRCUIT BOARDS

[75] Inventors: Beniamino Ferri, Monza; Giovanni Caimi, Saronno, both of Italy

[73] Assignee: Ferco S.r.l., Misinto, Italy

[21] Appl. No.: 318,365

[22] Filed: Nov. 5, 1981

[30] Foreign Application Priority Data

Nov. 10, 1980 [IT] Italy ............................... 25854 A/80

[51] Int. Cl.³ ....................... G01R 19/00; H05K 13/04
[52] U.S. Cl. .............................. 324/158 F; 324/73 AT; 414/5
[58] Field of Search ........... 324/158 F, 158 P, 73 AT; 29/574; 414/5, 730; 364/478

[56] References Cited

U.S. PATENT DOCUMENTS 2,965,229 12/1960 Snyder et al. ................. 324/73 AT
3,731,867 5/1973 Frisbie et al. ........................ 228/6
4,240,032 12/1980 Johnson et al. ................ 324/158 F
4,255,955 3/1981 Lee ...................................... 414/730

OTHER PUBLICATIONS

European Search Report.

Primary Examiner—Stewart J. Levy
Attorney, Agent, or Firm—Fleit, Jacobson, Cohn & Price

[57] ABSTRACT

This invention provides a process and apparatus comprising at least one unit to grip a microcomponent arranged at the top opening of a stack of microcomponents inside the magazine according to which the presence of said microcomponent is checked by the gripping members and the electrical efficiency thereof is then tested. The apparatus comprises various units, each of which comprises at least one gripping member to selectively draw and deliver a single microcomponent; a control member to operate said gripping means; a sensor to sense the presence of the microcomponent if positioned in the gripping member which, in case, also carries on measures to check the efficiency thereof. Then, if required, the absence or the presence of a faulty microcomponent is signalled.

8 Claims, 7 Drawing Figures

PROCESS AND APPARATUS TO CHECK THE PRESENCE AND/OR EFFICIENCY OF MICROCOMPONENTS DURING THE ASSEMBLING THEREOF ON PRINTED CIRCUIT BOARDS

This invention relates to a process and relative apparatus to assemble electronic microcomponents, such as chip type micrcomponents, which, as well known, comprise plates of nearly parallelopiped shape having the minor bases covered with a metal coating, which constitute the terminals of said microcomponent and allow the welding thereof onto a printed circuit. The present invention is suitable also for other types of microcomponents, such as MELFs and SOTs, which will be hereinafter referred to as microcomponents.

As well known, these microcomponents are extremely small, thus advantageously allowing to provide circuits of much reduced size, but without having to prepare integrated cards which, in case of a limited number of circuits to be implemented, are expensive. However, the smallness of said microcomponents makes the handling thereof extremely complicated and costly. Thus, in the production of even small series, such microcomponents would require the use of an automatic assembling on the respective printed circuit boards which are already arranged to receive them.

At present, the gripping members to assemble a single microcomponent on a printed circuit board do not provide any process and accordingly any relative device to check the presence and efficiency of the microcomponents that have to be assembled. These checks can be done only at a later time.

Therefore, it is the object of the present invention to provide a process and relative apparatus to check the presence of the microcomponents inside the gripping means and, in case, also the efficiency thereof before the assembling step of said microcomponents on the printed circuit boards, providing extremely good circuits at reduced costs.

The object has been accomplished by providing a process in which, as soon as the gripping means have gripped the microcomponent, its presence and/or functional efficiency is checked.

The relative apparatus to carry out the above specified process is characterized by comprising a sensor which engages itself with the microcomponent which is about to be gripped and then supplies the information, constituted by an electric signal, that said gripping means did engage with the microcomponent.

A preferred solution of the invention provides that said sensor particularly comprises a plunger.

A specific solution provides that the head located at the opposite end of the plunger relative to microcomponent engagement end is positioned within a cavity and signals through its displacement within said cavity that the gripping means has gripped the microcomponent.

A further specific solution of the present invention provides that the signal related to the presence and/or measure carried on the microcomponent occurs by means of contacts provided inside of the cavity, in which the plunger head is located, which cavity has a metalized surface containing terminal leads.

A further solution of the invention provides that the pliers constitute contact members, which are provided with suitably insulated terminals for signalling the presence or absence of the microcomponent, or directly the measure thereof.

The invention will now be further described in connection with an exemplary embodiment which has been schematically shown in the successive operating steps in the accompanying drawings, in which.

Figure 5:
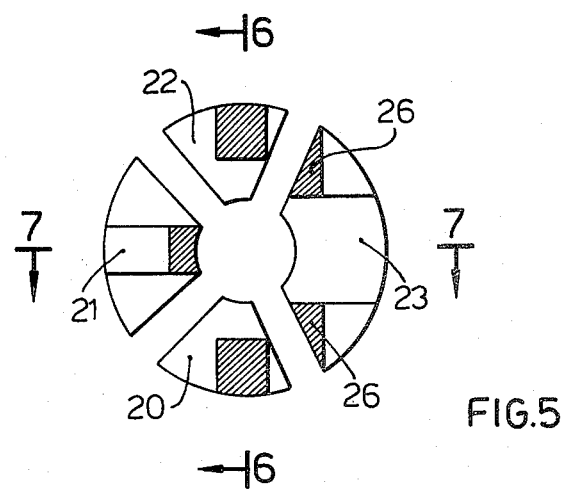
Figure 6:
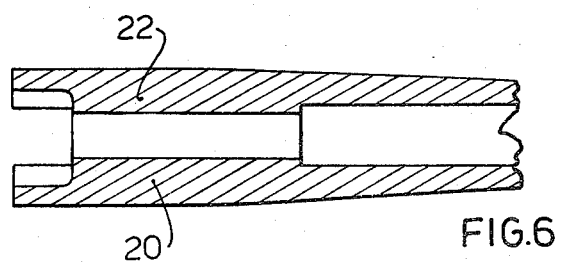
Figure 7:
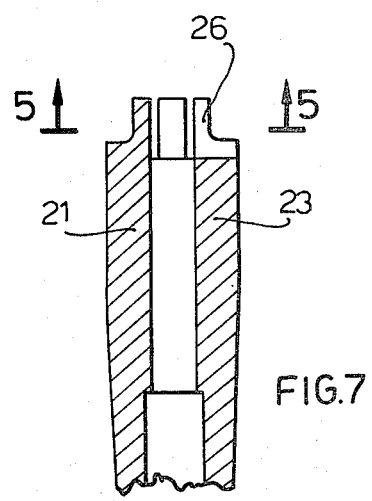

FIG. 5 is a view showing another embodiment of pliers for holding a microcomponent; and FIGS. 6 and 7 are sectional views taken along lines 6—6 and 7—7 of FIG. 5, respectively.

Figure 1:
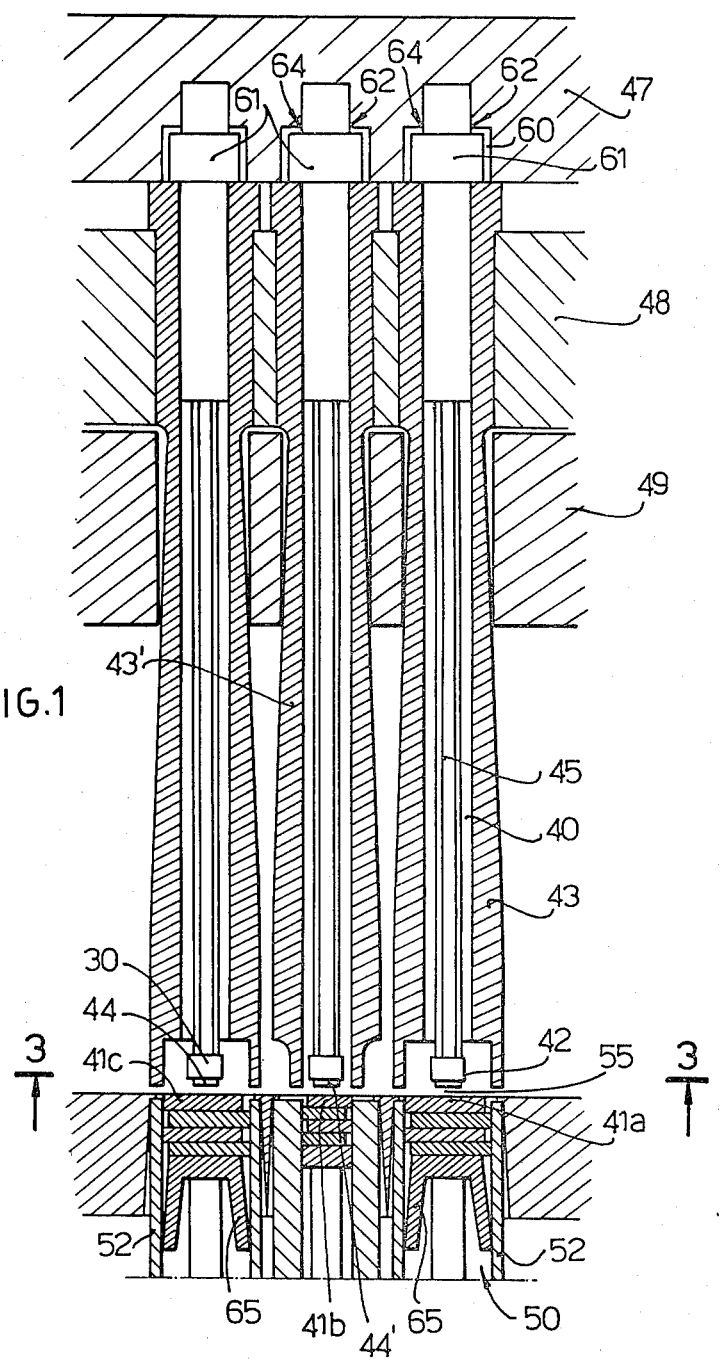
FIGS. 1 and 2 are views of an embodiment of the invention at two operating steps, both of the figures being sectional views taken along line 1—1 of FIG. 3.
Figure 2:
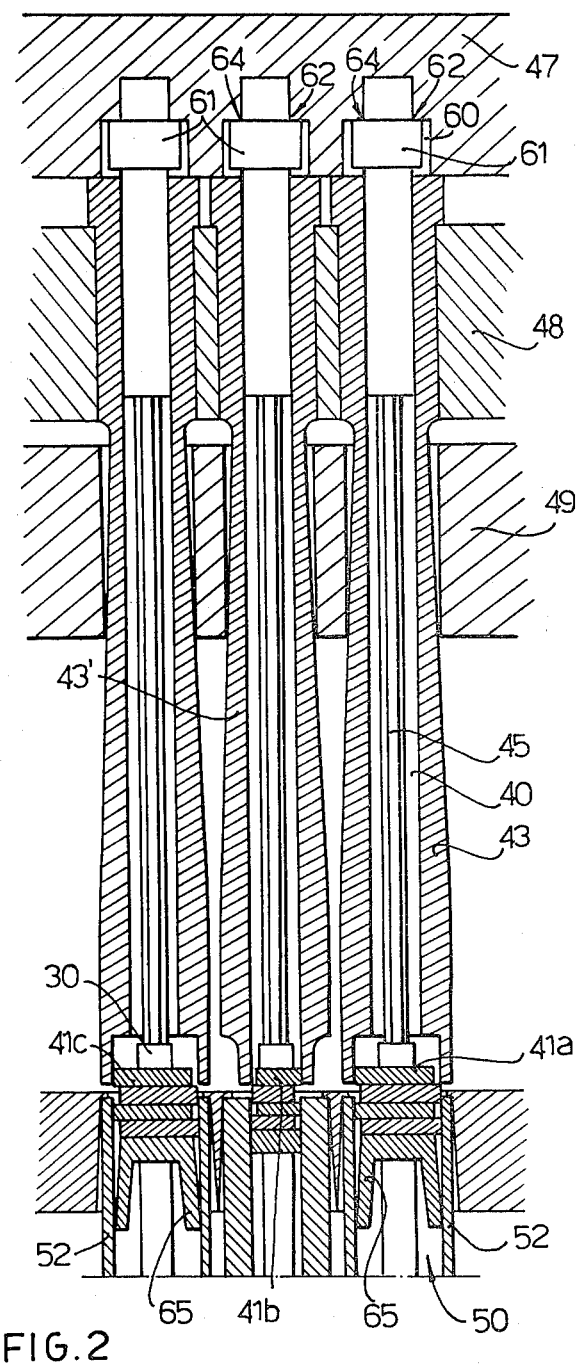
Figure 3:
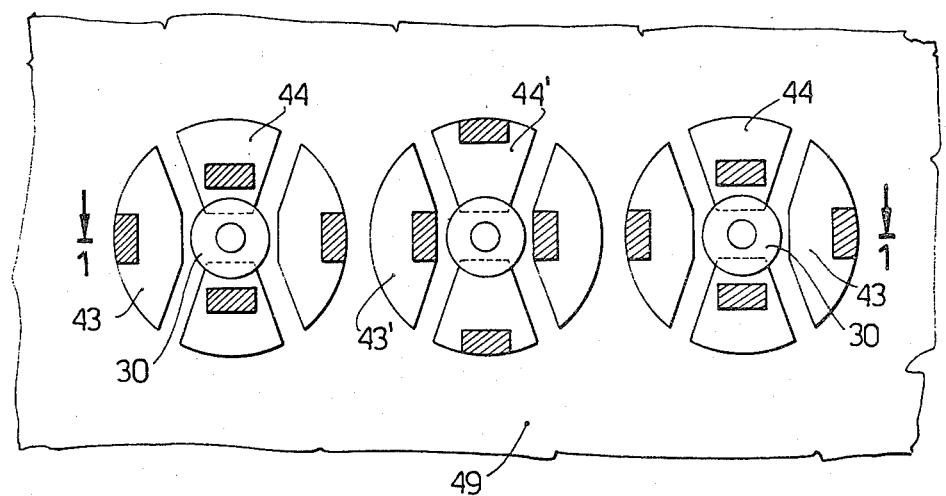
FIG. 3 is a sectional view of the gripping means particularly comprising pliers, the sectional view being taken along line 3—3 of FIG. 1.

Referring to the figures of the accompanying drawings, an embodiment of the invention will be described in the following, in which the gripping means comprise pliers having four legs arranged in pairs facing one another and each pairs being perpendicular to each other (see FIG. 3). The microcomponents contained in magazines 52, form stacks which are generally indicated at 50. In FIGS. 1 and 2, the microcomponents arranged at the end of each stack have been respectively indicated by the reference numeral 41a, 41b, 41c.

According to this embodiment the gripping means comprise four legs forming two pairs 43, 44 and 43', 44', respectively, which at the gripping zone are configurated to receive the respective microcomponent 41a, 41b, 41c. Means 43', 44' differ from means 43, 44 only because of their shape. As a matter of fact they can have any shape provided that they would carry on the gripping function.

For example, in FIGS. 5, 6 and 7, another type of gripping member comprising legs 20, 21, 22 and 23 is shown. These legs are configurated to grip through legs 21 and 23 microcomponent provided with pins so as not to damage the electric terminals.

Said gripping means, which will be hereinafter referred to as pliers, have internally a hole 40. Plungers 45 are positioned inside said hole 40 throughout the length of the pliers, such plungers terminating with an enlarged flat end 42 forming a collar 42 against which the microcomponent will abut.

In FIGS. 1 and 2 the zeroing plate 47, the pliers support plate 48 and the operating plate 49 are shown. The mutual movement of these plates to allow the gripping of the microcomponents are as follows; the support plate 48 supports the pliers so that the ends of the latter form a housing for the microcomponent 41a, 41b, 41c, being arranged at the free top openings 55 of magazines 52.

At the cycle start (FIG. 1), the operation plate 49 is arranged at the narrowest portion of the pliers legs, so that the microcomponents 41a, 41b, 41c can be received therein.

FIG. 2 shows the second step of the process: the pushers 65 push the stack 50 of components until the microcomponent 41a, 41b, 41c abuts against the surface 42 of the plunger, which in turn abuts against the bearing plate 48, then the pliers 43, 44 and 43', 44', respectively, grip the respective microcomponent 41a, 41b, 41c. This is provided by causing the operating plate 49 to slide towards the thickest zone of the pliers, so that the pliers are closed.

In the zeroing plate 47, for each gripping means a cavity is internally formed, in which cavity 60 the end head 61 of plunger 45 is positioned.

The positioning of the microcomponent 41a, 41b, 41c within the cavities 60 enables to signal that the microcomponent has been gripped.

A first embodiment provides that the signalling occurs by a change in capacity of a capacitor. The plates of said capacitor comprise the metalized surface of the end head 61 and the metalized surface of cavity 60, while the dielectrics is constituted by air.

A second embodiment provides that within said metalized cavity 60 conductive terminals 62 and 64 can be obtained. Then, the movement of the end head 61 closes one of these contacts.

Figure 4:
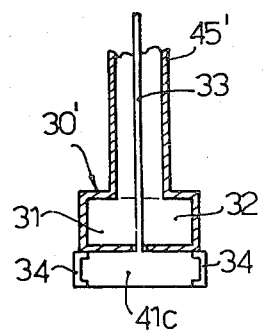
FIG. 4 is a longitudinal sectional view showing a variant of the sensor.

A further embodiment of the present invention provides that, where desiring to check the functional efficiency of the microcomponent and hence to carry out electrical measurements, the plunger 45' (FIG. 4) and relative collar 30' comprise two conductive parts 31 and 32, which are suitably insulated from each other by means of insulation 33 and located at the terminals 34 of the microcomponent 41c.

When the microcomponent contacts the flat end 42 of the plunger and accordingly a contact is established, an electric information is sensed from these conductive parts 31 and 32 and supplied through the plunger 45. This should always be centered with respect to the terminals 62 an 64, which are within the cavity 60 and suitably insulated from each other. According to the voltage values sensed by these terminals with respect to the reference value the efficiency of the microcomponent which is going to be positioned on the board can be tested.

A further embodiment provides that the pliers (43, 44 and 43', 44') which are suitably insulated also with respect to the pliers operating plate 49 and support plate 48, are the electric terminals through which the electric efficiency of the microcomponent is tested.

Where the presence of the microcomponent positioned on the pliers should not be sensed, a signal is generated in known manner to indicate this event. This alarm signal can also indicate the coordinates on the printed circuit board where the microcomponent lacks, as it has not been gripped by the pliers.

Similarly, a different type of signal is generated where the microcomponent gripped by the pliers and already placed on the printed circuit panel is found faulty during the efficiency checking operation.

Thus, in a known manner, the coordinates of the faulty microcomponent will also be provided.

The above described gripping means can be provided as serially connected, so as to grip and check all the microcomponents required for a given printed circuit board.

The present invention embraces all of those changes in detail that would become apparent to those skilled in the art.

We claim:

1. A process to check the presence and/or efficiency of microcomponents to be assembled on printed circuit boards comprising the steps of: gripping the microcomponent with a gripping apparatus, initially arranging the gripping apparatus in an open position at the top opening of each of a plurality of microcomponent magazines, wherein as soon as the gripping means has gripped the microcomponent, sensing the presence of said microcomponent by a sensing device in said apparatus and, if present, performing an electrical measurement of said microcomponent by a measurement device in said gripping apparatus.

2. An apparatus for checking the presence and/or efficiency of microcomponents to be assembled on a printed circuit board, comprising gripping means for gripping each of a series of microcomponents, said gripping means includng a sensor engaging the microcomponent and generating signals indicating whether the microcomponent has been gripped, and means for performing an electrical measurement of said microcomponent after the microcomponent has been gripped.

3. An apparatus according to claim 2, wherein said sensor comprises a plunger arranged inside of the gripping means, the displacement of which is sensed and constitutes the signal indicative of the presence or absence of the microcomponent.

4. An apparatus according to claim 3, wherein the end head of the plunger contacted by the microcomponent is within a cavity and the sensor generates signals indicating its displacement inside said cavity.

5. An apparatus according to claim 4, wherein the signalling of the displacement of the end head within the cavity closes a contact therein.

6. An apparatus according to claim 5, wherein said contact within the cavity comprises a conductive terminal on the metalized surface of said cavity.

7. An apparatus according to claim 2, wherein the sensor checking the electric efficiency of the microcomponent comprises suitably insulated pliers.

8. An apparatus according to claim 3, wherein the sensor engaging the microcomponent contains two suitably insulated conductive parts to sense the presence and/or the efficiency of the microcomponents.

* * * * *